(12) United States Patent
Tanaka et al.

(10) Patent No.: US 9,978,484 B2
(45) Date of Patent: May 22, 2018

(54) METAL NITRIDE FILM FOR THERMISTOR, PROCESS FOR PRODUCING SAME, AND THERMISTOR SENSOR OF FILM TYPE

(71) Applicant: MITSUBISHI MATERIALS CORPORATION, Tokyo (JP)

(72) Inventors: Hiroshi Tanaka, Naka (JP); Toshiaki Fujita, Naka (JP); Noriaki Nagatomo, Naka (JP); Kazutaka Fujiwara, Naka (JP); Hitoshi Inaba, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 604 days.

(21) Appl. No.: 14/389,229

(22) PCT Filed: Mar. 25, 2013

(86) PCT No.: PCT/JP2013/059796
§ 371 (c)(1),
(2) Date: Sep. 29, 2014

(87) PCT Pub. No.: WO2013/147290
PCT Pub. Date: Oct. 3, 2013

(65) Prior Publication Data
US 2015/0092820 A1  Apr. 2, 2015

(30) Foreign Application Priority Data

Mar. 30, 2012  (JP) ................. 2012-081107

(51) Int. Cl.
*G01K 7/00* (2006.01)
*H01C 7/00* (2006.01)
(Continued)

(52) U.S. Cl.
CPC ......... *H01C 7/008* (2013.01); *C23C 14/0641* (2013.01); *G01K 7/22* (2013.01);
(Continued)

(58) Field of Classification Search
CPC .......... G01K 7/226; G01K 7/22; H01C 7/008; H01C 7/04
See application file for complete search history.

(56) References Cited

U.S. PATENT DOCUMENTS

2003/0062984 A1*  4/2003  Ito .................. H01C 7/008
338/25

FOREIGN PATENT DOCUMENTS

CN  104025211 A  9/2014
CN  104169699 A  11/2014
(Continued)

OTHER PUBLICATIONS

Office Action dated May 16, 2016, issued for the corresponding Chinese patent application No. 201380013405.2 and English translation and Japanese translation thereof.
(Continued)

*Primary Examiner* — Lisa Caputo
*Assistant Examiner* — Janice M Soto
(74) *Attorney, Agent, or Firm* — Locke Lord LLP

(57) ABSTRACT

Provided are a metal nitride film for a thermistor, which has an excellent bending resistance and can be directly deposited on a film or the like without firing, a method for producing the same, and a film type thermistor sensor. The metal nitride film for a thermistor, which consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, and the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) is 0.1 or lower in X-ray diffraction.

3 Claims, 11 Drawing Sheets

(51) Int. Cl.
*H01C 7/04* (2006.01)
*H01C 17/065* (2006.01)
*H01C 17/12* (2006.01)
*G01K 7/22* (2006.01)
*C23C 14/06* (2006.01)

(52) U.S. Cl.
CPC ............... *G01K 7/226* (2013.01); *H01C 7/04* (2013.01); *H01C 17/06513* (2013.01); *H01C 17/12* (2013.01)

(56) References Cited

FOREIGN PATENT DOCUMENTS

| EP | 1313134 A1 | 5/2003 |
|---|---|---|
| JP | H0590011 A | 4/1993 |
| JP | 2004319737 A | 11/2004 |
| JP | 20134640 A | 7/2013 |
| WO | WO-2013/147282 A1 | 10/2013 |

OTHER PUBLICATIONS

Extended European Search Report for European Application No. 13767726.6 dated Oct. 15, 2015.
International Search Report dated Apr. 23, 2013 for PCT/JP2013/059796.

* cited by examiner (a)　　　　　　　　(b)　　　　　　　　(c)

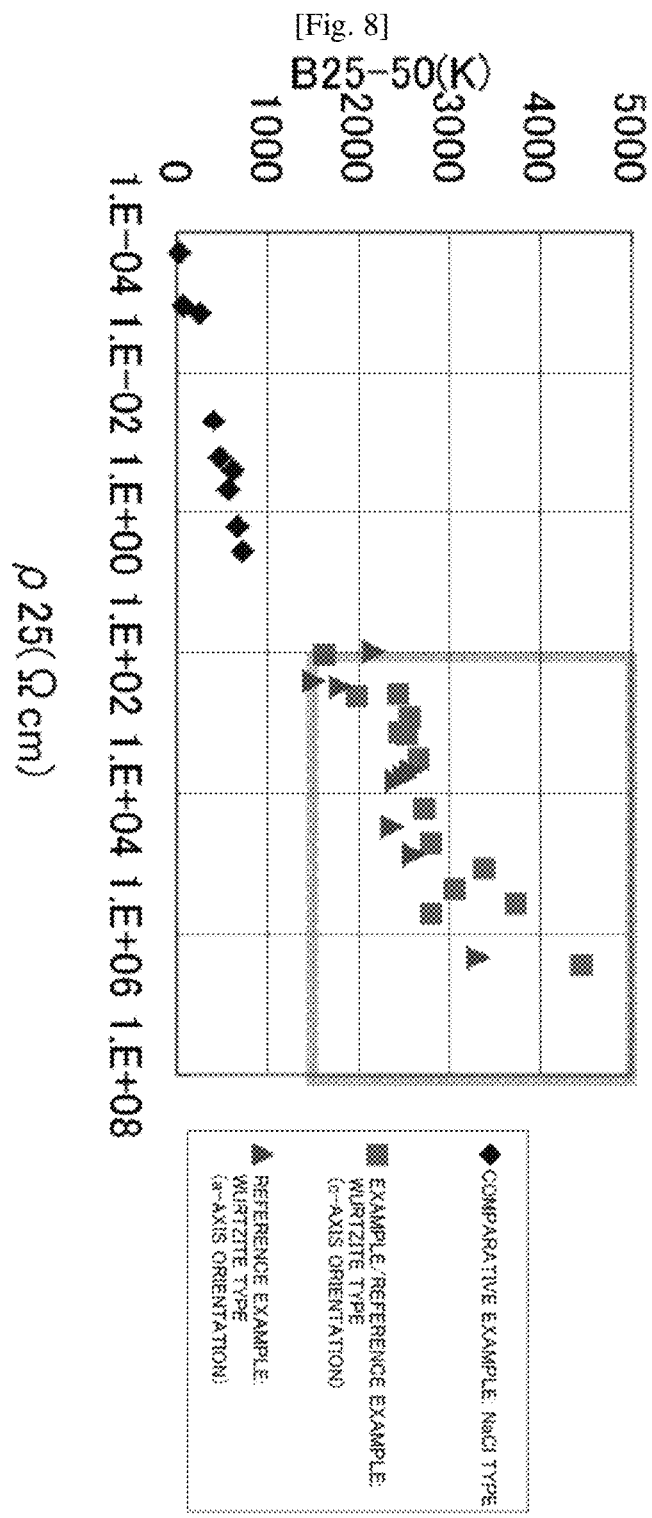

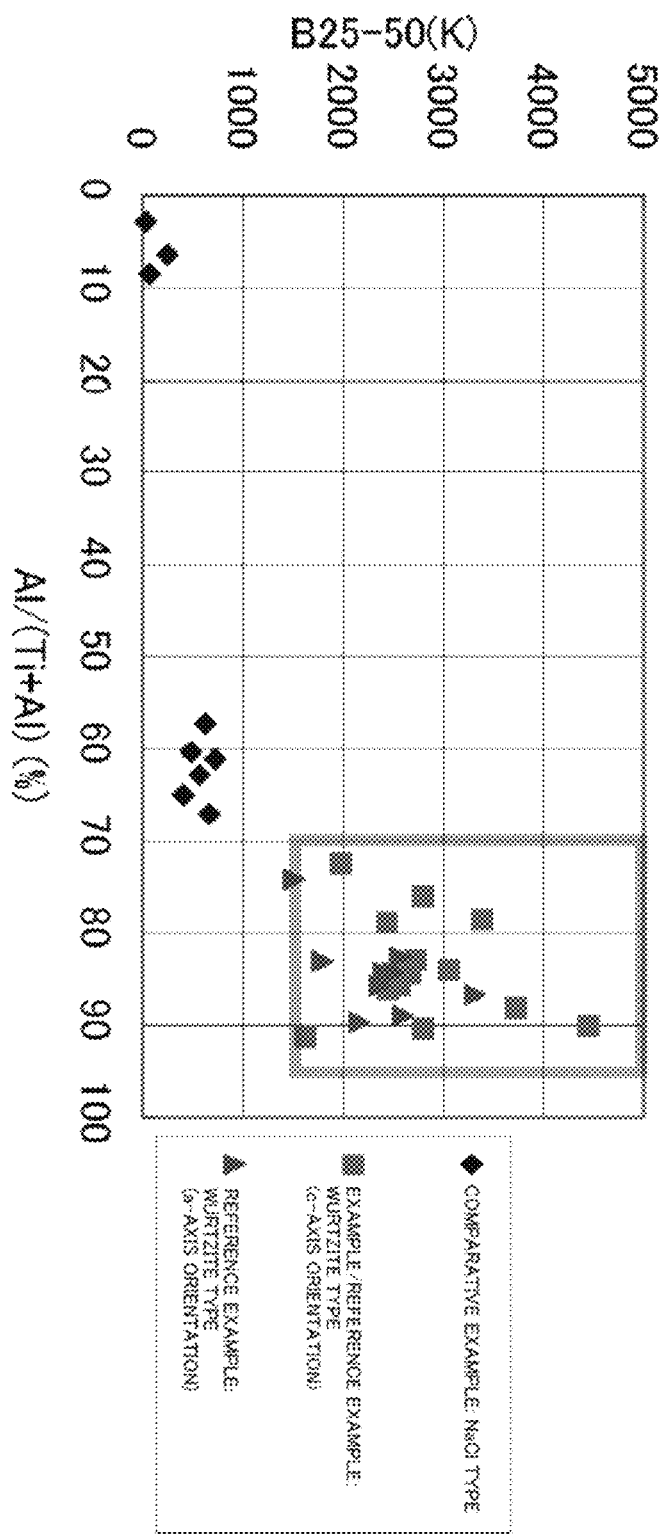
[Fig. 9]

[Fig. 10]
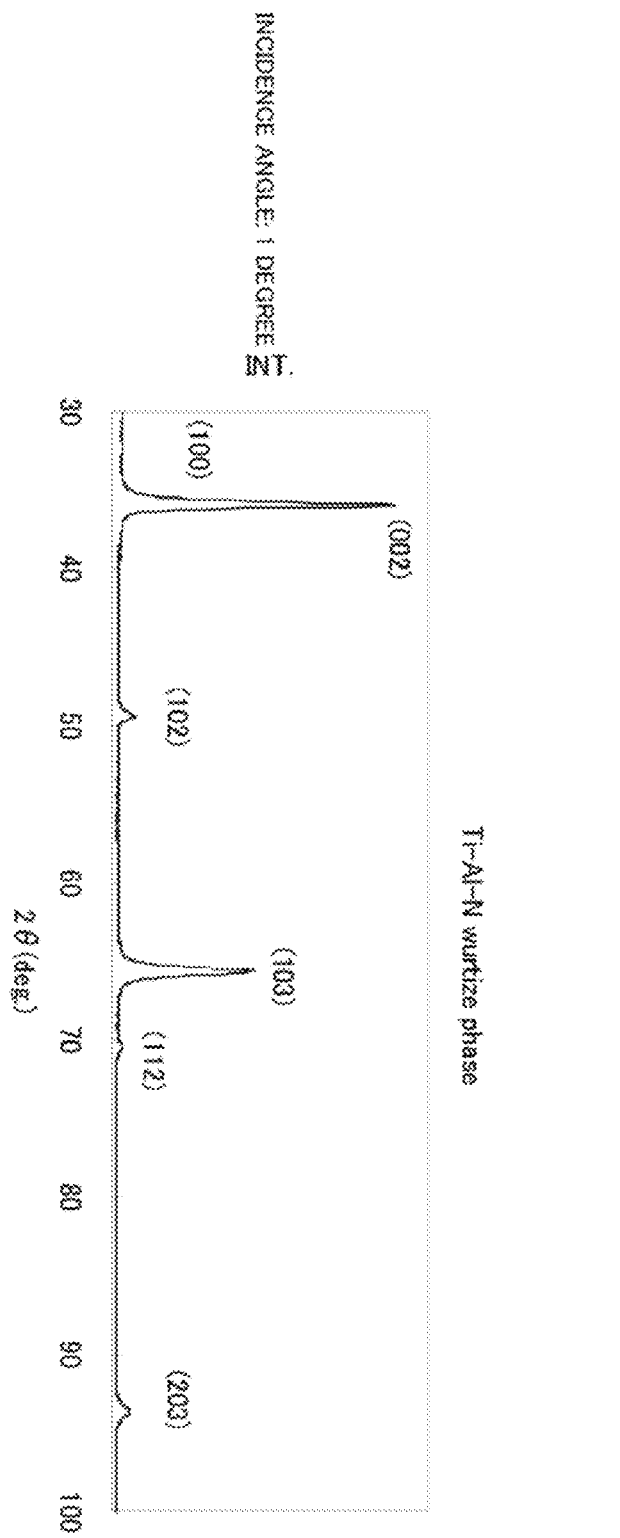

[Fig. 11]
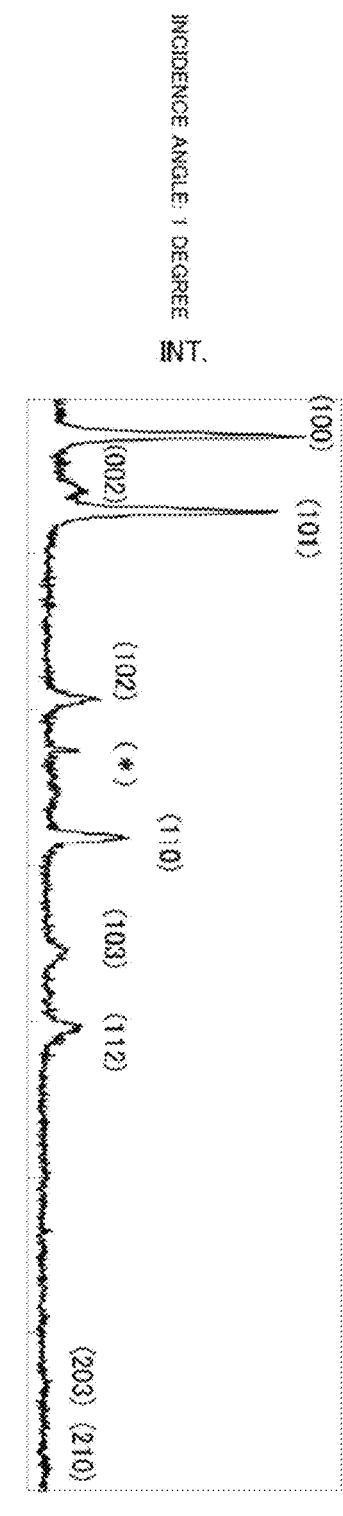
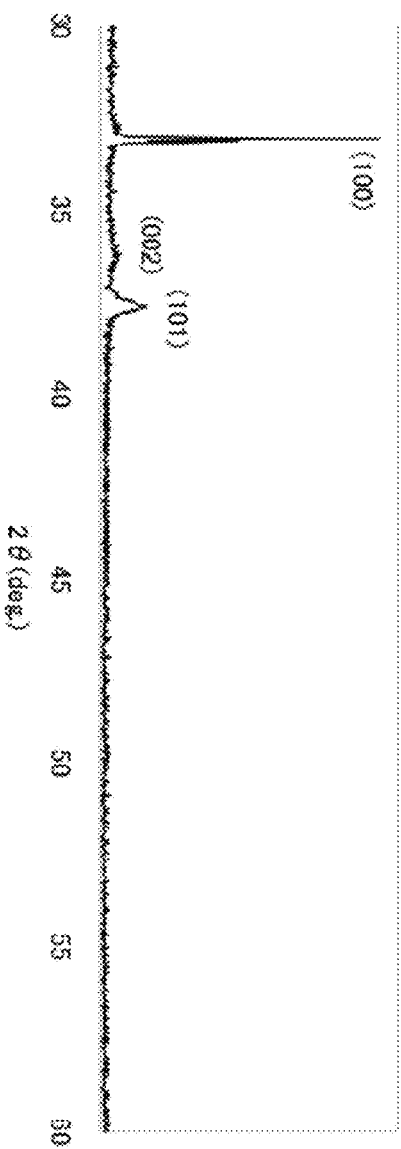

[Fig. 12]
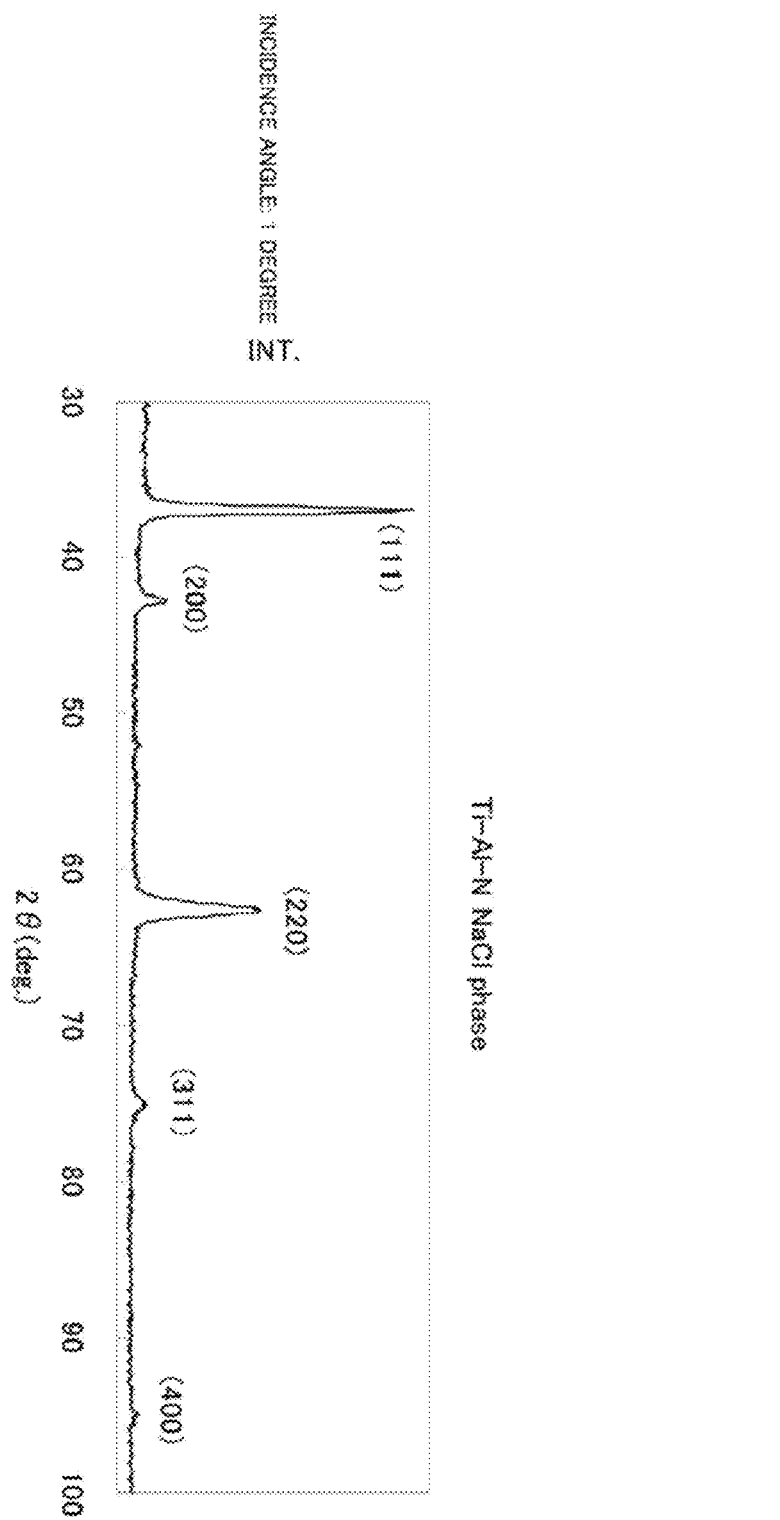

METAL NITRIDE FILM FOR THERMISTOR, PROCESS FOR PRODUCING SAME, AND THERMISTOR SENSOR OF FILM TYPE

BACKGROUND OF THE INVENTION

Field of the Invention

The present invention relates to a metal nitride film for a thermistor, which can be directly deposited on a film or the like without firing, a method for producing the same, and a film type thermistor sensor.

Description of the Related Art

There is a demand for a thermistor material used for a temperature sensor or the like having a high B constant in order to obtain a high precision and high sensitivity temperature sensor. Conventionally, transition metal oxides such as Mn, Co, Fe, and the like are typically used as such thermistor materials (see Patent Documents 1 and 2). These thermistor materials also need firing at a temperature of 600° C. or higher in order to obtain a stable thermistor characteristic/property.

In addition to thermistor materials consisting of metal oxides as described above, Patent Document 3 discloses a thermistor material consisting of a nitride represented by the general formula: $M_xA_yN_z$ (where "M" represents at least one of Ta, Nb, Cr, Ti, and Zr, "A" represents at least one of Al, Si, and B, $0.1 \leq x \leq 0.8$, $0 < y \leq 0.6$, $0.1 \leq z \leq 0.8$, and $x+y+z=1$). In Patent Document 3, only a Ta—Al—N-based material consisting of a nitride represented by the general formula: $M_xA_yN_z$ (where $0.5 \leq x \leq 0.8$, $0.1 \leq y \leq 0.5$, $0.2 \leq z \leq 0.7$, and $x+y+z=1$) is described as an Example. The Ta—Al—N-based material is produced by sputtering in a nitrogen gas-containing atmosphere using a material containing the element(s) listed above as a target. The resultant thin film is subject to a heat treatment at a temperature from 350 to 600° C. as required.

PRIOR ART DOCUMENTS

Patent Documents

[Patent Document 1] Japanese Patent Laid-Open No. 2003-226573
[Patent Document 2] Japanese Patent Laid-Open No. 2006-324520
[Patent Document 3] Japanese Patent Laid-Open No. 2004-319737

SUMMARY OF THE INVENTION

Problems to be Solved by the Invention

The following problems still remain in the conventional technologies described above.

In recent years, the development of a film type thermistor sensor made of a thermistor material formed on a resin film has been considered, and thus, it has been desired to develop a thermistor material that can be directly deposited on a film. Specifically, it is expected that a flexible thermistor sensor will be obtained by using a film. Furthermore, it is desired to develop a very thin thermistor sensor having a thickness of about 0.1 mm. However, a substrate material using a ceramic material such as alumina that has often been conventionally used has a problem that if the substrate material is thinned to a thickness of 0.1 mm for example, the substrate material is very fragile and breaks easily. Thus, it is expected that a very thin thermistor sensor will be obtained by using a film.

However, a film made of a resin material typically has a low heat resistance temperature of 150° C. or lower, and even polyimide, which is known as a material having a relatively high heat resistance temperature, only has a heat resistance to a temperature of about 200° C. Hence, when a heat treatment is performed in a process of forming a thermistor material, it has been conventionally difficult to use such a thermistor material. Therefore, since the above-described conventional oxide thermistor material needs to be fired at a temperature of 600° C. or higher in order to realize a desired thermistor characteristic, a film type thermistor sensor in which the thermistor material is directly deposited on a film cannot be realized using such a thermistor material. Thus, it has been desired to develop a thermistor material that can be directly deposited on a film without firing. However, even the thermistor material disclosed in Patent Document 3 still needs a heat treatment on the resultant thin film at a temperature from 350 to 600° C. as required in order to obtain a desired thermistor characteristic. Regarding this thermistor material, a B constant of about 500 to 3000 K was obtained in an Example of the Ta—Al—N-based material, but the heat resistance of this material is not described and therefore, the thermal reliability of a nitride-based material is unknown.

Furthermore, when a thermistor material layer is deposited on a film, there is a disadvantage that a crack may occur in the thermistor material layer when the film is bent, which reduces its reliability.

The present invention has been made in view of the aforementioned circumstances, and an object of the present invention is to provide a metal nitride film for a thermistor that can be directly deposited on a film or the like without firing and has an excellent bending resistance, a method for producing the same, and a film type thermistor sensor.

Means for Solving the Problems

The present inventors' serious endeavor carried out by focusing on an Al—N-based material among nitride materials found that an Al—N-based material having a good B constant and an excellent heat resistance may be obtained without firing by substituting the Al site with a specific metal element for improving electric conductivity and by ordering it into a specific crystal structure even though Al—N is an insulator and difficult to provide with an optimum thermistor characteristic (B constant: about 1000 to 6000 K). It was also found that when film stress is controlled so that such a material has a specific orientation characteristic, a film having a high bending resistance can be obtained.

Therefore, the present invention has been made on the basis of the above finding, and adopts the following configuration in order to overcome the aforementioned problems.

Specifically, a metal nitride film for a thermistor according to a first aspect of the present invention is characterized by a metal nitride film used for a thermistor, which consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, and the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) is 0.1 or lower in X-ray diffraction.

Since the metal nitride film for a thermistor consists of a metal nitride represented by the general formula: $Ti_xAl_yN_z$ (where $0.70 \leq y/(x+y) \leq 0.95$, $0.4 \leq z \leq 0.5$, and $x+y+z=1$) and the crystal structure thereof is a hexagonal wurtzite-type single phase, a good constant B and an excellent heat resistance can be obtained without firing.

In addition, since the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) is 0.1 or lower in X-ray diffraction, the film stress can be controlled so as to suppress the occurrence of a crack when the film is bent.

The reason why the aforementioned peak ratio is set to 0.1 or lower is because a crack occurs when a bending test (curvature radius: 6 mm) is performed only once in the case where the peak ratio exceeds 0.1.

Note that when the value of "y/(x+y)" (i.e., Al/(Ti+Al)) is less than 0.70, a wurtzite-type single phase cannot be obtained, but two coexisting phases of a wurtzite-type phase and a NaCl-type phase or a single phase of only a NaCl-type phase may be obtained. Consequently, a sufficiently high resistance and a high B constant cannot be obtained.

When the value of "y/(x+y)" (i.e., Al/(Ti+Al)) exceeds 0.95, the metal nitride exhibits very high resistivity and extremely high electrical insulation. Therefore, such a metal nitride is not applicable as a thermistor material.

When the value of "Z" (i.e., N/(Ti+Al+N) is less than 0.4, the amount of nitrogen contained in the metal is too small to obtain a wurtzite-type single phase. Consequently, a sufficiently high resistance and a high B constant cannot be obtained.

Furthermore, when the value of "z" (i.e., N/(Ti+Al+N)) exceeds 0.5, a wurtzite-type single phase cannot be obtained. This is because the correct stoichiometric ratio of N/(Ti+Al+N) in a wurtzite-type single phase without defects at the nitrogen site is 0.5.

A film type thermistor sensor according to a second aspect of the present invention is characterized by comprising an insulating film; a thin film thermistor portion made of the metal nitride film for a thermistor according to the first aspect of the present invention formed on the insulating film; and a pair of pattern electrodes formed at least on or under the thin film thermistor portion.

Specifically, in this film type thermistor sensor, since the thin film thermistor portion made of the metal nitride film for a thermistor according to the first aspect of the present invention formed on the insulating film, an insulating film having a low heat resistance, such as a resin film, can be used because the thin film thermistor portion is formed without firing and has a high B constant and a high heat resistance. Consequently, a thin and flexible thermistor sensor having an excellent bending resistance and a good thermistor characteristic can be obtained.

In addition, a substrate material employing a ceramic such as alumina that has often been conventionally used has a problem that if the substrate material is thinned to a thickness of 0.1 mm for example, the substrate material is very fragile and breaks easily. On the other hand, since a film can be used in the present invention, a very thin film type thermistor sensor having a thickness of 0.1 mm or less can be obtained, for example.

A method for producing the metal nitride film for a thermistor according to a third aspect of the present invention is characterized in that a method for producing the metal nitride film for a thermistor according to the first aspect of the present invention includes a deposition step of performing film deposition by reactive sputtering in a nitrogen-containing atmosphere using a Ti—Al alloy sputtering target wherein the sputtering gas pressure during the reactive sputtering is set to 0.41 Pa or lower.

Specifically, in the method for producing the metal nitride film for a thermistor, since film deposition is performed by reactive sputtering in a nitrogen-containing atmosphere using a Ti—Al alloy sputtering target, the metal nitride film for a thermistor of the present invention, which consists of the aforementioned Ti—Al—N, can be deposited on a film without firing.

In addition, since a sputtering gas pressure during the reactive sputtering is set to 0.41 Pa or lower, a film made of the metal nitride for a thermistor according to the first aspect of the present invention, which is more strongly oriented along the c-axis than the a-axis in a vertical direction with respect to the surface of the film and has an aforementioned peak ratio of 0.1 or lower, can be formed.

Effects of the Invention

According to the present invention, the following effects may be provided.

Specifically, since the metal nitride film for a thermistor according to the present invention consists of a metal nitride represented by the general formula: $Ti_xAl_yN_z$ (where $0.70 \leq y/(x+y) \leq 0.95$, $0.4 \leq z \leq 0.5$, and $x+y+z=1$) and the crystal structure thereof is a hexagonal wurtzite-type single phase, a good constant B and an excellent heat resistance can be obtained without firing. In addition, since the peak ratio of the diffraction peak intensity of a-axis orientation (100) relative to the diffraction peak intensity of c-axis orientation (002) is 0.1 or lower in X-ray diffraction, a high bending resistance can be obtained.

Also, in the method for producing the metal nitride film for a thermistor according to the present invention, since film deposition is performed by reactive sputtering at a sputtering gas pressure set to 0.41 Pa or lower in a nitrogen-containing atmosphere using a Ti—Al alloy sputtering target, the metal nitride film for a thermistor of the present invention, which consists of the aforementioned Ti—Al—N and has an aforementioned peak ratio of 0.1 or lower, can be deposited on a film without firing.

Furthermore, in the film type thermistor sensor according to the present invention, since a thin film thermistor portion made of the metal nitride film for a thermistor according to the present invention is formed on an insulating film, a thin and flexible thermistor sensor having an excellent bending resistance and a good thermistor characteristic can be obtained by using an insulating film having a low heat resistance such as a resin film. Furthermore, since a substrate material is not a ceramic material which becomes very fragile and breaks easily when being thinned but a resin film, a very thin film type thermistor sensor having a thickness of 0.1 mm or less is obtained.

BRIEF DESCRIPTION OF THE DRAWINGS

FIG. 8 is a graph illustrating the relationship between a resistivity at 25° C. and a B constant for films according to Examples, Reference Examples, and Comparative Examples of the present invention.

FIG. 9 is a graph illustrating the relationship between an Al/(Ti+Al) ratio and a B constant for films according to Examples, Reference Examples, and Comparative Examples of the present invention.

FIG. 10 is a graph illustrating the result of X-ray diffraction (XRD) performed on a film according to the Example of the present invention having an Al/(Ti+Al) ratio of 0.84 and a strong c-axis orientation.

FIG. 11 is a graph illustrating the result of X-ray diffraction (XRD) performed on a film according to the Example of the present invention having an Al/(Ti+Al) ratio of 0.83 and a strong a-axis orientation.

FIG. 12 is a graph illustrating the result of X-ray diffraction (XRD) performed on a film according to the Comparative Example of the present invention having an Al/(Ti+Al) ration of 0.60.

DESCRIPTION OF THE EMBODIMENTS

Figure 1:
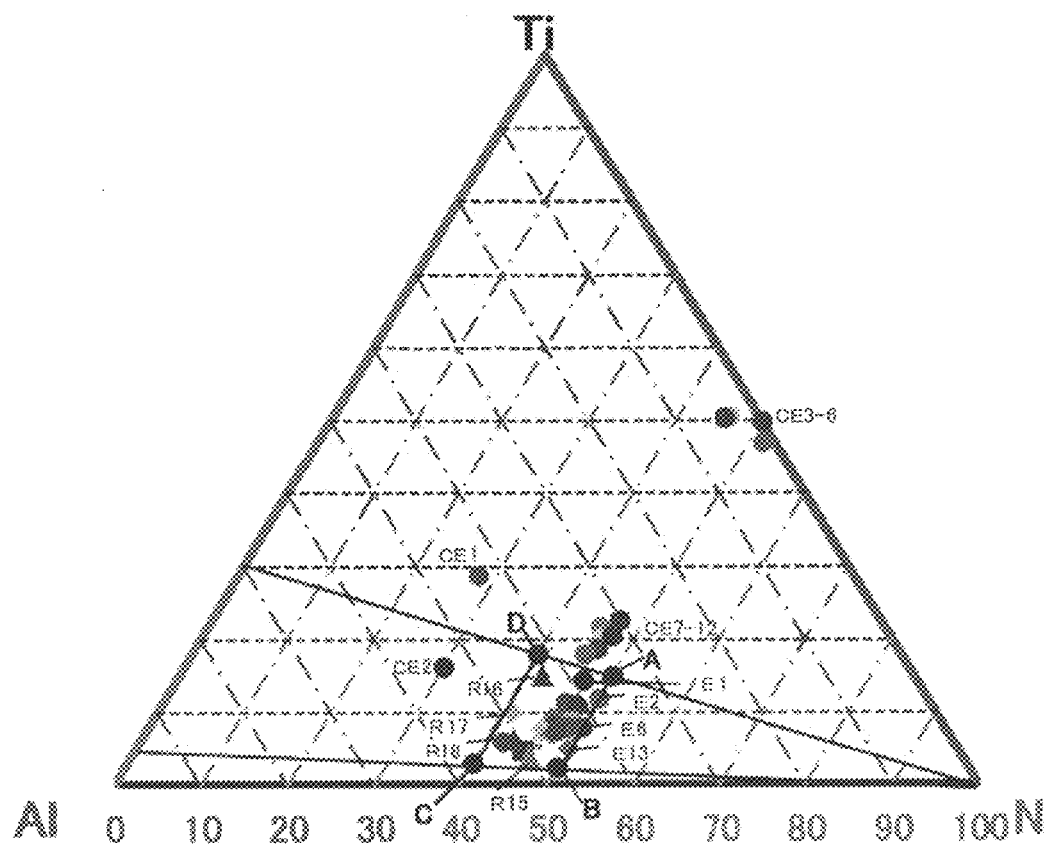
FIG. 1 is a Ti—Al—N-based ternary phase diagram illustrating the composition range of a metal nitride film for a thermistor according to one embodiment of a metal nitride film for a thermistor, a method for producing the same, and a film type thermistor sensor of the present invention.

Hereinafter, a metal nitride film for a thermistor, a method for producing the same, and a film type thermistor sensor according to one embodiment of the present invention will be described with reference to FIGS. 1 to 3. In the drawings used in the following description, the scale of each component is changed as appropriate so that each component is recognizable or is readily recognized.

The metal nitride film for a thermistor of the present embodiment, which consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type (space group: $P6_3mc$ (No. 186)) single phase having a hexagonal crystal system. Specifically, this metal nitride film for a thermistor consists of metal nitride having a composition within the region enclosed by the points A, B, C, and D in the Ti—Al—N-based ternary phase diagram as shown in FIG. 1, wherein the crystal phase thereof is a wurtzite-type.

Note that the composition ratios of (x, y, z) (at %) at the points A, B, C, and D are A (15, 35, 50), B (2.5, 47.5, 50), C (3, 57, 40), and P (18, 42, 40), respectively.

In addition, in this metal nitride for a thermistor, the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) is 0.1 or lower in X-ray diffraction as shown in FIG. 10 for example.

Specifically, this metal nitride for a thermistor is more strongly oriented along the c-axis than the a-axis in a vertical direction with respect to the surface of the film. Furthermore, this metal nitride for a thermistor is a columnar crystal extending in a vertical direction with respect to the surface of the film.

Note that the decision about whether the metal nitride for a thermistor has a strong a-axis orientation (100) or a strong c-axis orientation (002) in a vertical direction with respect to the surface of the film (film thickness direction) and the peak ratio of the diffraction peak intensity of a-axis orientation (100) relative to the diffraction peak intensity of c-axis orientation (002) are determined by examining the orientation of the crystal axis using X-ray diffraction (XRD) and by measuring the peak intensity ratio of (100)/(002), where (100) is the Miller index indicating a-axis orientation and (002) is the Miller index indicating c-axis orientation.

Next, a film type thermistor sensor employing the metal nitride film for a thermistor of the present embodiment will be described.

Figure 2:
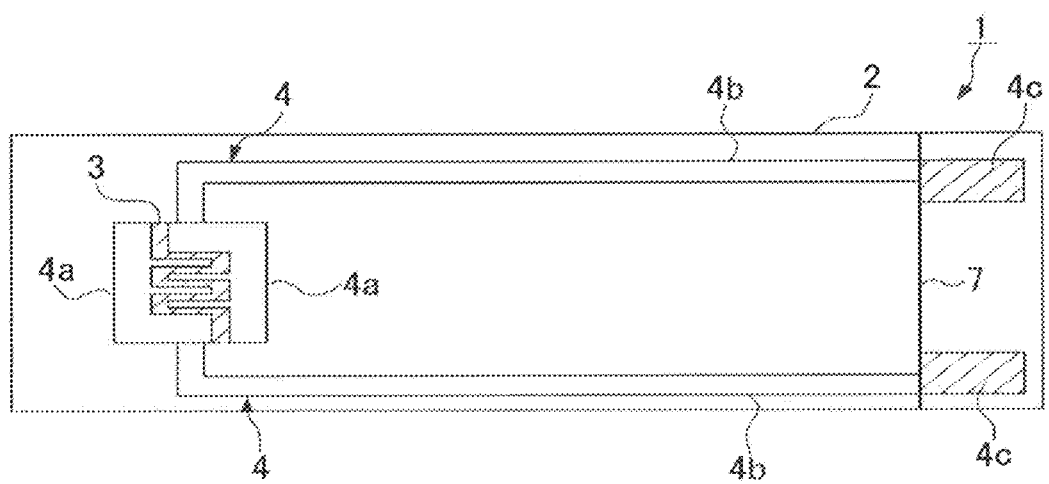
FIG. 2 is a plan view illustrating a film type thermistor sensor according to the present embodiment.
Figure 3:
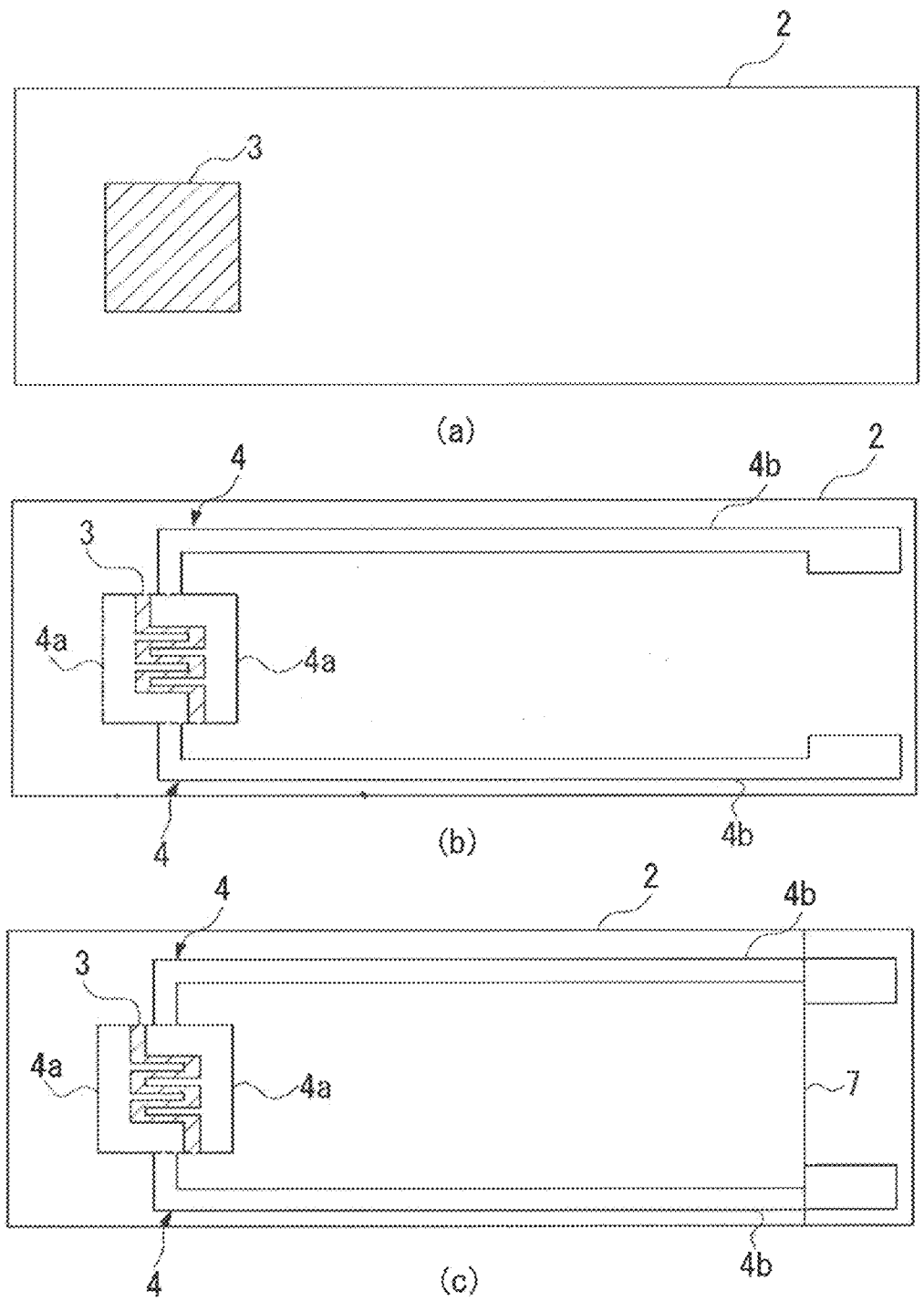
FIG. 3 is a plan view illustrating a method for producing a film type thermistor sensor in the order of steps according to the present embodiment.
Figure 4:
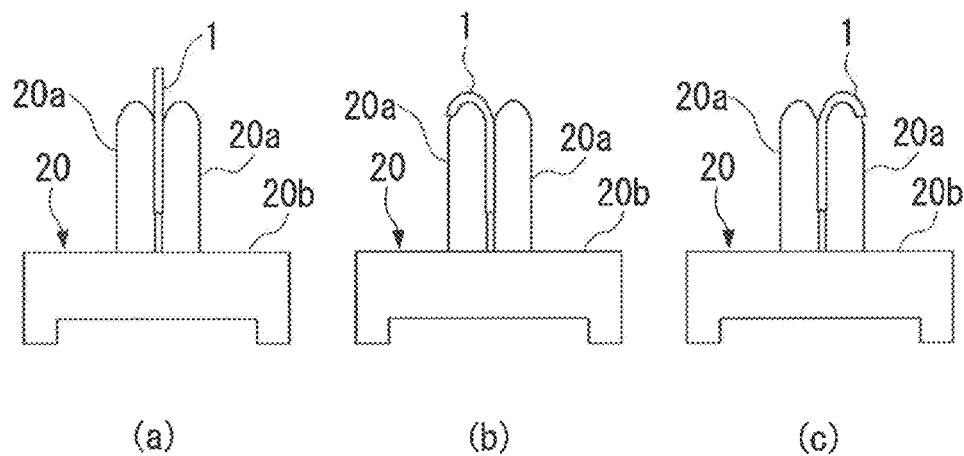
FIG. 4 is a diagram illustrating a bending resistance test for metal nitride films for a thermistor according to Examples of a metal nitride film for a thermistor, a method for producing the same, and a film type thermistor sensor of the present invention.

A film type thermistor sensor 1 of the present embodiment includes an insulating film 2; a thin film thermistor portion 3 made of a Ti—Al—N thermistor material, formed on the insulating film 2; and a pair of pattern electrodes 4 formed on the insulating film 2 with a pair of opposed electrode portions 4a being arranged so as to be opposed to each other on the thin film thermistor portion 3, as shown in FIG. 2.

The pair of opposed electrode portions 4a covers the entire surface of the thin film thermistor portion 3 excluding the region between the opposed electrode portions.

The insulating film 2 is a polyimide resin sheet formed in a band shape having a thickness of 7.5 to 125 μm for example. The insulating film 2 may be made of another material such as polyethylene terephthalate (PET), polyethylene naphthalate (PEN), or the like.

The pair of pattern electrodes 4 has a Cr or Ni—Cr bonding layer having a film thickness of 5 to 100 nm formed on the thin film thermistor portion 3, and an electrode layer made of a noble metal such as Au having a film thickness of 50 to 1000 nm formed on the bonding layer.

The pair of pattern electrodes 4 has the pair of opposed electrode portions 4a that is a pair of comb shaped electrode portions having a comb shaped pattern that is arranged so as to be opposed to each other, and a pair of linear extending portions 4b extending with the tip ends thereof being connected to these comb shaped electrode portions 4a and the base ends thereof being arranged at the end of the insulating film 2.

In addition, a placing portion 4c such as Au plating is formed as a lead wire drawing portion on the base end of each of the pair of linear extending portions 4b. One end of the lead wire is joined with the plating portion 4c via a solder material or the like. Furthermore, except for the end of the insulating film 2 including the plating portions 4c, a polyimide coverlay film 7 is pressure bonded to the insulating film 2. Instead of the polyimide coverlay film 7, a polyimide or epoxy-based resin material may be formed on the insulating film 2 by printing.

Hereinafter, a method for producing the film type thermistor sensor 1 will be described with reference to FIG. 3. The method for producing the film type thermistor sensor 1 of the present embodiment includes the steps of: forming a thin film thermistor portion for patterning the thin film thermistor portion 3 on the insulating film 2; and forming an electrode for patterning the pair of electrodes 4 on the insulating film 2 with the pair of opposed electrode portions 4a being arranged so as to be opposed to each other on the thin film thermistor portion 3.

A more specific example of the method for producing the film type thermistor sensor 1 includes a step of depositing the thin film thermistor portion 3 consisting of $Ti_xAl_yN_z$ (where x=8, y=44, and z=48) and having a film thickness of 200 nm on the insulating film 2 made of a polyimide film having a thickness of 50 cm by a reactive sputtering method using a metal mask in a nitrogen-containing atmosphere using a Ti—Al alloy sputtering target. The sputtering conditions at this time are as follows: an ultimate vacuum: $5 \times 100^{-6}$ Pa, a sputtering gas pressure: 0.41 Pa or lower, a target input power (output): 300 W, and a percentage of nitrogen gas in a mixed gas (Ar gas+nitrogen gas) atmosphere: 20%.

In this way, the thin film thermistor portion 3 is formed in a square shape having one side of 1.6 mm as shown in FIG. 3(a).

Then, a bonding layer made of a Cr film having a film thickness of 20 nm is formed on the thin film thermistor portion 3 and the insulating film 2 by a sputtering method. Furthermore, an electrode layer made of an Au film having a film thickness of 200 nm is formed on this bonding layer by a sputtering method.

Next, a resist solution was coated on the deposited electrode layer using a spin coater, and then pre-baking was performed for 1.5 minutes at a temperature of 110° C. After exposure by an exposure device, any unnecessary portion was removed by a developing solution, and then patterning was performed by post-baking for 5 minutes at a temperature of 150° C. Then, any unnecessary electrode portion was subject to wet etching using commercially available Au etchant and Cr etchant in that order, and then the resist was stripped so as to form the pair of pattern electrodes 4 as desired, as shown in FIG. 3(b). At this time, the pair of opposed electrode portions 4a is patterned so as to cover the entire surface of the thin film thermistor portion 3 with the pair of opposed electrode portions 4a together forming its contour in a substantially square shape having one side of 1.0 to 1.9 mm and with the thin film thermistor portion 3 being arranged at the center.

Next, as shown in FIG. 3(c), the polyimide coverlay film 7 with an adhesive having a thickness of 20 μm, for example, is placed on the insulating film 2, and then bonded to each other under pressurization of 2 MPa at a temperature of 150° C. for 10 minutes using a press machine. Furthermore, as shown in FIG. 2, an Au thin film having a thickness of 2 μm is formed at the base ends of the linear extending portions 4b using an Au plating solution so as to form the plating portions 4c, for example.

When a plurality of temperature sensors 1 is simultaneously produced, a plurality of thin film thermistor portions 3 and a plurality of pattern electrodes 4 are formed on a large-format sheet of the insulating film 2 as described above, and then, the resulting large-format sheet is cut into a plurality of segments so as to obtain a plurality of film type thermistor sensors 1.

In this manner, a thin film type thermistor sensor 1 having a size of 16×4.0 mm and a thickness of 0.08 mm is obtained.

As described above, since the metal nitride film for a thermistor of the present embodiment consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type single phase having a hexagonal crystal system, a good constant B and an excellent heat resistance can be obtained without firing.

In addition, since the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) is 0.1 or lower in X-ray diffraction, the film stress can be controlled so as to suppress the occurrence of a crack when the film is bent.

Furthermore, since the metal nitride for a thermistor is a columnar crystal extending in a vertical direction with respect to the surface of the film, the crystallinity of the film is high. Consequently, a high heat resistance can be obtained.

Note that, since this metal nitride for a thermistor is more strongly oriented along the c-axis than the a-axis in a vertical direction with respect to the surface of the film, a high B constant as compared with the case of a strong a-axis orientation can be obtained.

In the method for producing the metal nitride film for a thermistor of the present embodiment, since film deposition is performed by reactive sputtering in a nitrogen-containing atmosphere using a Ti—Al alloy sputtering target, the metal nitride film for a thermistor, which consists of the aforementioned Ti—Al—N, can be deposited on a film without firing.

When the sputtering gas pressure during the reactive sputtering is set to 0.41 Pa or lower, a film made of the metal nitride for a thermistor, which is more strongly oriented along the c-axis than the a-axis in a vertical direction with respect to the surface of the film and has an aforementioned peak ratio of 0.1 or lower, can be formed.

Thus, in the film type thermistor sensor 1 of the present embodiment, since the thin film thermistor portion 3 made of the above-described metal nitride film for a thermistor is formed on the insulating film 2, the insulating film 2 having a low heat resistance, such as a resin film, can be used because the thin film thermistor portion 3 is formed without firing, and has a high B constant and a high heat resistance. Consequently, a thin and flexible thermistor sensor having an excellent bending resistance and a good thermistor characteristic can be obtained.

In addition, a substrate material employing a ceramic such as alumina that has often been conventionally used has a problem that if the substrate material is thinned to a thickness of 0.1 mm for example, the substrate material is very fragile and breaks easily. On the other hand, since a film can be used in the present invention, a very thin film type thermistor sensor having a thickness of 0.1 mm or less can be obtained, for example.

EXAMPLES

Next, the evaluation results of the films according to Examples produced based on the above embodiments regarding the metal nitride film for a thermistor, the method for producing the same, and the film type thermistor sensor according to the present invention will be specifically described with reference to FIGS. 4 to 15.

<Bending Test>

A bending test was performed on film type thermistor sensors according to Examples for bending, which were produced based on the above-described embodiments, by bending them into concave and convex shapes with a curvature radius of 6 mm alternately 100 times each. After the test, the thin film thermistor portions were observed and confirmed whether or not there was a crack therein. Specifically, each of the film type thermistor sensors 1 produced as described above was held between a pair of holding members 20a arranged standing on a base 20b of a fixture 20 for bending test as shown in FIG. 4(a) and then the thin film thermistor portion 3 was bent in a left and right direction 100 times each as shown in FIGS. 4(b) and 4(c). Each tip of the pair of holding members 20a has an arc shape with a cross-section of 6 mm in curvature radius. Specifically, each of the film type thermistor sensors was placed with the thin film thermistor portion being located on the tips of the holding members 20a having a curvature radius of 6 mm to perform the above-described test. Each of the thin film thermistor portions was observed from the insulating film side to confirm whether or not there was a crack therein. The electric properties change before and after the test was also evaluated at the same time. These evaluation results are shown in Table 1.

Film stress of the film type thermistor sensors according to Examples for bending was also determined using the following calculation formula and calculated values. These results are also shown in Table 1. Note that the "substrate" in the following formula corresponds to the insulating film.

Film stress=((Young's modulus of substrate)×(Thickness of substrate)$^2$)/((1−Poisson's ratio of substrate)×6×(Curvature radius)×(Film thickness of thin film))  [Formula 1]

(where, "Young's modulus of substrate" is 5.8 Gpa, "Thickness of substrate" is 50 μm, "Film thickness of thin film" is 200 nm, and "Poisson's ratio of substrate" is 0.3.)

Figure 5:
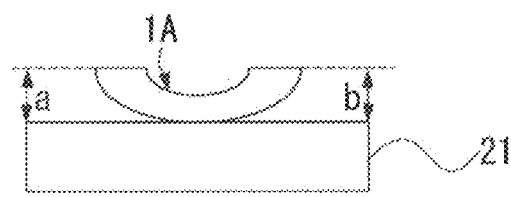
FIG. 5 is a diagram illustrating the warpage of a film according to Example for bending, seen from the above, with the film being arranged standing in a warpage measurement method of a metal nitride film for a thermistor.

The "curvature radius" in the above-described formula was determined by calculating the amount of warpage and the curvature radius from the mean values of the deflected distances "a" and "b" of both sides of a sample 1A for warping with respect to a plate member 21 before and after the deposition, in a state that the sample, which was produced by depositing only the thin film thermistor portion 3 on the entire surface of the insulating film 2, was arranged standing upright along the plate member 21 that is in a standing state, as shown in FIG. 5.

Figure 6:
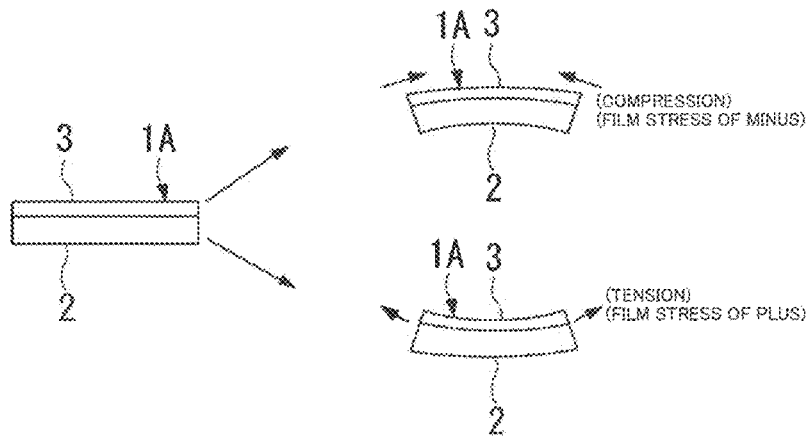
FIG. 6 is a diagram illustrating the compression and tension of a film in terms of strength of materials according to Example of the present invention.

Note that the determined film stress is expressed with a minus sign in the case where stress was applied in a compression direction and with a plus sign in the case where stress was applied in a tensile direction as shown in FIG. 6.

In the above-described sample 1A for warping, the thin film thermistor portion 3 having a film thickness of 200 nm, which consists of $Ti_xAl_yN_z$ (where x=8, y=44, and z=48), was deposited on the entire surface of the insulating film 2 made of a polyimide film having a size of 4 inches (101.6 mm) and a thickness of 50 μm by a reactive sputtering method using a metal mask in a nitrogen-containing atmosphere using a Ti—Al alloy sputtering target. The sputtering conditions at this time are as follows: an ultimate vacuum: $5×10^{-6}$ Pa, a sputtering gas pressure: 0.13 to 0.41 Pa, a target input power (output): 300 W, and a percentage of nitrogen gas in a mixed gas (Ar gas+nitrogen gas) atmosphere: 20% as shown in Table 1.

Film type thermistor sensors according to Comparative Examples for bending, in which each of the thin film thermistor portions was deposited under a sputtering gas pressure of 0.45 to 0.67 Pa at an aforementioned peak ratio exceeding 0.1, were also produced for comparison and evaluated in the same manner. Table 1 shows the deposition conditions such as a sputtering gas pressure and the like when each of the thin film thermistor portions are deposited, and the aforementioned peak ratios thereof in XRD.

The results of this evaluation show that a crack occurs in the film type thermistor sensors according to the Comparative Examples for bending in which the aforementioned peak ratio exceeds 0.1, while no crack occurs in the film type thermistor sensors according to any Examples for bending of the present invention in which the film stress is 20 MPa or lower.

In addition, the change rate of resistance value and the change rate of B constant are large in each of the sensors according to Comparative Examples for bending, while the change rates of resistance value is 0.4% or lower and the change rate of B constant is 0.2% or lower in each sensor according to the Examples for bending with no crack, from which it can be confirmed that the sensors according to the Examples have an excellent bendability because the change of electric properties is small.

TABLE 1

| | SPUTTERING CONDITIONS | | | XRD PEAK INTENSITY RATIO OF (100)/(002) | CRYSTAL AXIS EXHIBITING STRONG DEGREE OF ORIENTATION IN VERTICAL DIRECTION WITH RESPECT | |
|---|---|---|---|---|---|---|
| | OUTPUT (W) | GAS PRESSURE (Pa) | PERCENTAGE OF NITROGEN (%) | WHEN CRYSTAL PHASE IS WURTZITE TYPE | TO SUBSTRATE SURFACE WHEN CRYSTAL PHASE IS WURTZITE TYPE (a-AXIS OR c-AXIS) | CALCULATED FILM STRESS (MPa) |
| COMPARATIVE EXAMPLE 1 | 300 | 0.45 | 20 | 0.33 | c-AXIS | 238 |
| COMPARATIVE EXAMPLE 2 | 300 | 0.07 | 20 | 2.56 | c-AXIS | 317 |
| EXAMPLE 1 | 300 | 0.13 | 20 | <0.01 | c-AXIS | −345 |
| EXAMPLE 2 | 300 | 0.37 | 20 | 0.06 | c-AXIS | −190 |

TABLE 1-continued

| | | | | | | |
|---|---|---|---|---|---|---|
| EXAMPLE 3 | 300 | 0.40 | 20 | 0.07 | c-AXIS | −127 |
| EXAMPLE 4 | 300 | 0.41 | 20 | 0.1 | c-AXIS | 20 |

| | | RESULTS OF BENDING TEST | | |
|---|---|---|---|---|
| | AMOUNT OF WARPAGE (mm) ① | OCCURRENCE OF CRACK | CHANGE RATE OF RESISTANCE VALUE (%) ② | CHANGE RATE OF B CONSTANT (%) ③ |
| COMPARATIVE EXAMPLE 1 | 20 | YES | 6.9 | −2.0 |
| COMPARATIVE EXAMPLE 2 | 33 | YES | 8.0 | −2.3 |
| EXAMPLE 1 | FULL | NO | 0.4 | 0.2 |
| EXAMPLE 2 | −15 | NO | 0.3 | 0.2 |
| EXAMPLE 3 | −95 | NO | 0.2 | 0.1 |
| EXAMPLE 4 | 10 | NO | 0.3 | 0.2 |

<Production of Film Evaluation Element>

Figure 7:
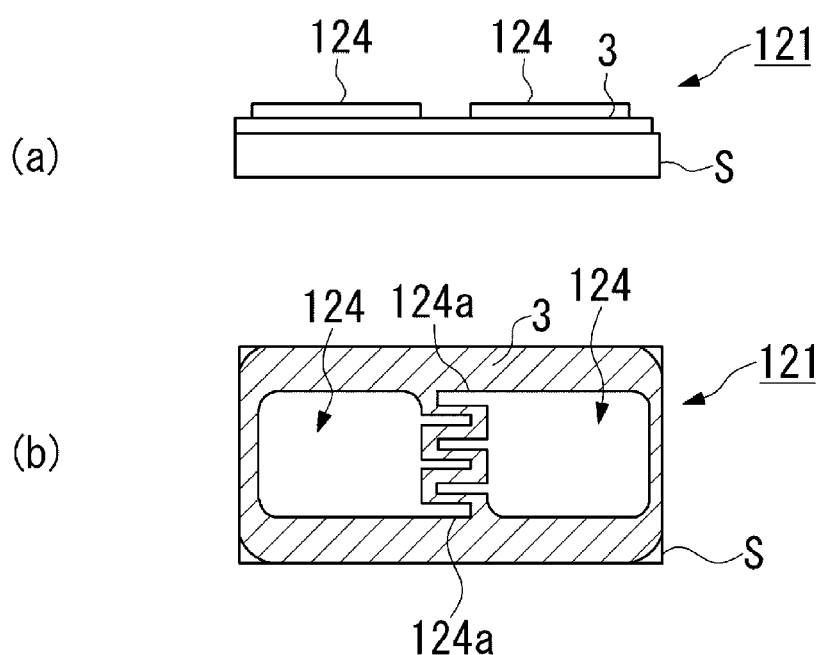
FIG. 7 is a front view and a plan view illustrating a film evaluation element made of a metal nitride film for a thermistor according to Example of a metal nitride film for a thermistor, a method for producing the same, and a film type thermistor sensor of the present invention.

The film evaluation elements 121 shown in FIG. 7 were produced in Examples and Comparative Examples of the present invention.

Firstly, each of the thin film thermistor portions 3 having a thickness of 500 nm, which were made of the metal nitride for a thermistor with various composition ratios shown in Table 2, was formed on an Si wafer with a thermal oxidation film as an Si substrate S by a reactive sputtering method using Ti—Al alloy targets with various composition ratios. The sputtering conditions at this time are as follows: an ultimate vacuum: $5 \times 10^{-6}$ Pa, a sputtering gas pressure: 0.1 to 1 Pa, a target input power (output): 100 to 500 W, and a percentage of nitrogen gas in a mixed gas (Ar gas+nitrogen gas) atmosphere: 10 to 100%.

Next, a Cr film having a thickness of 20 nm was formed and an Au film having a thickness of 100 nm was further formed on each of the thin film thermistor portions 3 by a sputtering method. Furthermore, a resist solution was coated on the stacked metal films using a spin coater, and then pre-baking was performed for 1.5 minutes at a temperature of 110° C. After exposure by an exposure device, any unnecessary portion was removed by a developing solution, and then patterning was performed by post-baking for 5 minutes at a temperature of 150° C. Then, any unnecessary electrode portion was subject to wet etching using commercially available Au etchant and Cr etchant, and then the resist was stripped so as to form the pair of pattern electrodes 124, each having the desired comb shaped electrode portion 124a. Then, the resultant elements were diced into chip elements so as to obtain film evaluation elements 121 used for evaluating a B constant and for testing heat resistance.

Note that the film evaluation elements 121 according to Comparative Examples, which have the composition ratios of $Ti_xAl_yN_z$ outside the range of the present invention and have different crystal systems, were similarly produced for comparative evaluation.

<Film Evaluation>

(1) Composition Analysis

Elemental analysis was performed by X-ray photoelectron spectroscopy (XPS) on the thin film thermistor portions 3 obtained by the reactive sputtering method. In the XPS, a quantitative analysis was performed on a sputtering surface at a depth of 20 nm from the outermost surface by Ar sputtering. The results are shown in Table 2. In the following tables, the composition ratios are expressed by "at %".

In the X-ray photoelectron spectroscopy (XPS), a quantitative analysis was performed under the conditions of an X-ray source of MgKα (350 W), a path energy of 58.5 eV, a measurement interval of 0.125 eV, a photo-electron take-off angle with respect to a sample surface of 45 degrees, and an analysis area of about 800 μmφ. Note that the quantitative accuracy of N/(Ti+Al+N) and Al/(Ti+Al) was ±2% and ±1%, respectively.

(2) Specific Resistance Measurement

The specific resistance of each of the thin film thermistor portions 3 obtained by the reactive sputtering method was measured by the four-probe method at a temperature of 25° C. The results are shown in Table 2.

(3) Measurement of B Constant

The resistance values for each of the film evaluation elements 121 at temperatures of 25° C. and 50° C. were measured in a constant temperature bath, and a B constant was calculated based on the resistance values at temperatures of 25° C. and 50° C. The results are shown in Table 2.

In the B constant calculating method of the present invention, a B constant is calculated by the following formula using the resistance values at temperatures of 25° C. and 50° C. as described above.

$$B \text{ constant (K)} = \ln(R25/R50)/(1/T25 - 1/T50)$$

R25 (Ω): resistance value at 25° C.
R50 (Ω) resistance value at 50° C.
T25 (K): 298.15 K, which is an absolute temperature of 25° C. expressed in Kelvin
T50 (K): 323.15 K, which is an absolute temperature of 50° C. expressed in Kelvin As can be seen from these results, a thermistor characteristic of a resistivity of 100 Ωcm or higher and a B constant of 1500 K or higher is achieved in all of the Examples in which the composition ratios of $Ti_xAl_yN_z$ fall within the region enclosed by the points A, B, C, and D in the ternary phase diagram shown in FIG. 1, i.e., the region where "0.70≤y/(x+y)≤0.95, 0.4≤z≤0.5, and x+y+z=1".

A graph illustrating the relationship between a resistivity at 25° C. and a B constant obtained from the above results is shown in FIG. 8. In addition, a graph illustrating the relationship between an Al/(Ti+Al) ratio and a B constant is shown in FIG. 9. These graphs show that the thin film thermistor portions 3, the composition ratios of which fall within the region where Al/(Ti+Al) is from 0.7 to 0.95 and N/(Ti+Al+N) is from 0.4 to 0.5 and each crystal system of which is a hexagonal wurtzite-type single phase, have a specific resistance value at a temperature of 25° C. of 100 Ωcm or higher and a B constant of 1500 K or higher, which are the regions realizing a high resistance and a high B constant. Note that, in data shown in FIG. 9, the reason why the B constant varies with respect to nearly the same Al/(Ti+Al) ratio is because the thin film thermistor portions 3 have different amounts of nitrogen in their crystals.

In the films according to Comparative Examples 3 to 12 shown in Table 2, the composition ratios fall within the region where Al/(Ti+Al)<0.7, and each crystal system thereof is a cubic NaCl-type phase. In addition, in the film according to Comparative Example 12 (Al/(Ti+Ai)=0.67), a NaCl-type phase and a wurtzite-type phase coexist. Thus, a film with the composition ratio that falls within the region where Al/(Ti—Al)<0.7 has a specific resistance value at a temperature of 25° C. of less than 100 Ωcm and a B constant of less than 1500 K, which are the regions of a low resistance and a low B constant.

In the films according to Comparative Examples 1 and 2 shown in Table 2, the composition ratios fall within the region where N/(Ti+Al+N) is less than 40%, that is, the films are in a crystal state where nitridation of metals contained therein is insufficient. The films according to Comparative Example 1 and 2 were neither a NaCl-type nor wurtzite-type phase and had very poor crystallinity. In addition, it was found that the films according to these Comparative Examples exhibited near-metallic behavior because both the B constant and the resistance value were very small.

(4) Thin Film X-Ray Diffraction (Identification of Crystal Phase)

The crystal phases of the thin film thermistor portions 3 obtained by the reactive sputtering method were identified by Grazing Incidence X-ray Diffraction. The thin film X-ray diffraction is a small angle X-ray diffraction experiment. The measurement was performed under the conditions of a Cu X-ray tube, an incidence angle of 1 degree, and 2θ of from 20 to 130 degrees. Some of the samples were measured under the conditions of an incidence angle of 0 degree and 2θ of from 20 to 100 degrees.

The results of the measurement show that a wurtzite-type phase (hexagonal, the same phase as that of Al—N) was obtained in the region where Al/(Ti+Al)≥0.7, whereas a NaCl-type phase (cubic, the same phase as that of Ti—N) was obtained in the region where Al/(Ti+Al)<0.65. In addition, two coexisting phases of a wurtzite-type phase and a NaCl-type phase were obtained in the region where 0.65<Al/(Ti+Al)<0.7.

Thus, in the Ti—Al—N-based material, the regions of a high resistance and a high B constant can be realized by the wurtzite-type phase having a composition ratio of Al/(Ti+Al)≥0.7. In the Examples of the present invention, no impurity phase was confirmed and each crystal structure thereof was a wurtzite-type single phase.

In Comparative Examples 1 and 2 shown in Table 2, each crystal phase thereof was neither a wurtzite-type nor NaCl-type phase as described above, and thus, could not be identified in the testing. In these Comparative Examples, the peak width of XRD was very large, showing that the films had very poor crystallinity. It is contemplated that the crystal phases thereof were metal phases with insufficient nitridation because they exhibited near-metallic behavior from the viewpoint of electric properties.

TABLE 2

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURZITE TYPE (a-AXIS OR c-AXIS) | SPUTTERING GAS PRESSURE (Pa) | COMPOSITION RATIO | | | | RESULT OF ELECTRIC PROPERTIES | |
|---|---|---|---|---|---|---|---|---|---|---|
| | | | | | Ti(%) | Al (%) | N(%) | Al/(Ti + Al) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 29 | 43 | 28 | 60 | <0 | 2.E−04 |
| COMPARATIVE EXAMPLE 2 | UNKNOWN (INSUFFICIENT NITRIDATION) | — | — | — | 16 | 54 | 30 | 77 | 25 | 4.E−04 |
| COMPARATIVE EXAMPLE 3 | NaCl TYPE | — | — | — | 50 | 0 | 50 | 0 | <0 | 2.E−05 |
| COMPARATIVE EXAMPLE 4 | NaCl TYPE | — | — | — | 47 | 1 | 52 | 3 | 30 | 2.E−04 |
| COMPARATIVE EXAMPLE 5 | NaCl TYPE | — | — | — | 51 | 3 | 46 | 6 | 248 | 1.E−03 |
| COMPARATIVE EXAMPLE 6 | NaCl TYPE | — | — | — | 50 | 5 | 45 | 9 | 89 | 1.E−03 |
| COMPARATIVE EXAMPLE 7 | NaCl TYPE | — | — | — | 23 | 30 | 47 | 57 | 622 | 3.E−01 |
| COMPARATIVE EXAMPLE 8 | NaCl TYPE | — | — | — | 22 | 33 | 45 | 60 | 477 | 2.E−01 |
| COMPARATIVE EXAMPLE 9 | NaCl TYPE | — | — | — | 21 | 32 | 47 | 61 | 724 | 4.E+00 |
| COMPARATIVE EXAMPLE 10 | NaCl TYPE | — | — | — | 20 | 34 | 46 | 63 | 564 | 5.E−01 |
| COMPARATIVE EXAMPLE 11 | NaCl TYPE | — | — | — | 19 | 35 | 46 | 65 | 402 | 5.E−02 |
| COMPARATIVE | NaCl | — | — | — | 18 | 37 | 45 | 67 | 685 | 2.E+00 |

TABLE 2-continued

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURZITE TYPE (a-AXIS OR c-AXIS) | SPUTTERING GAS PRESSURE (Pa) | Ti(%) | Al (%) | N(%) | Al/(Ti + Al) (%) | B CONSTANT (K) | SPECIFIC RESISTANCE VALUE AT 25° C. (Ω cm) |
|---|---|---|---|---|---|---|---|---|---|---|
| EXAMPLE 12 | TYPE + WURTZITE TYPE | | | | | | | | | |
| EXAMPLE 1 | WURTZITE TYPE | 0.05 | c-AXIS | <0.67 | 15 | 38 | 47 | 72 | 1980 | 4.E+02 |
| EXAMPLE 2 | WURTZITE TYPE | 0.07 | c-AXIS | <0.67 | 12 | 38 | 50 | 76 | 2798 | 5.E+04 |
| REFERENCE EXAMPLE 3 | WURTZITE TYPE | 0.45 | c-AXIS | <0.67 | 11 | 42 | 47 | 79 | 3385 | 1.E+05 |
| EXAMPLE 4 | WURTZITE TYPE | <0.01 | c-AXIS | <0.67 | 11 | 41 | 48 | 79 | 2437 | 4.E+02 |
| REFERENCE EXAMPLE 5 | WURTZITE TYPE | 0.34 | c-AXIS | <0.67 | 9 | 43 | 48 | 83 | 2727 | 2.E+04 |
| EXAMPLE 6 | WURTZITE TYPE | <0.01 | c-AXIS | <0.67 | 8 | 42 | 50 | 84 | 3057 | 2.E+05 |
| EXAMPLE 7 | WURTZITE TYPE | 0.09 | c-AXIS | <0.67 | 8 | 44 | 48 | 84 | 2665 | 3.E+03 |
| EXAMPLE 8 | WURTZITE TYPE | 0.05 | c-AXIS | <0.67 | 8 | 44 | 48 | 85 | 2527 | 1.E+03 |
| EXAMPLE 9 | WURTZITE TYPE | <0.01 | c-AXIS | <0.67 | 8 | 45 | 47 | 86 | 2557 | 8.E+02 |
| EXAMPLE 10 | WURTZITE TYPE | 0.04 | c-AXIS | <0.67 | 7 | 46 | 46 | 86 | 2449 | 1.E+03 |
| REFERENCE EXAMPLE 11 | WURTZITE TYPE | 0.24 | c-AXIS | <0.67 | 7 | 48 | 45 | 88 | 3729 | 4.E+05 |
| REFERENCE EXAMPLE 12 | WURTZITE TYPE | 0.73 | c-AXIS | <0.67 | 5 | 49 | 46 | 90 | 2798 | 5.E+05 |
| EXAMPLE 13 | WURTZITE TYPE | <0.01 | c-AXIS | <0.67 | 5 | 45 | 50 | 90 | 4449 | 3.E+06 |
| REFERENCE EXAMPLE 14 | WURTZITE TYPE | 0.38 | c-AXIS | <0.67 | 5 | 50 | 45 | 91 | 1621 | 1.E+02 |
| REFERENCE EXAMPLE 15 | WURTZITE TYPE | 0.13 | c-AXIS | <0.67 | 4 | 50 | 46 | 93 | 3439 | 6.E+05 |
| REFERENCE EXAMPLE 16 | WURTZITE TYPE | 3.54 | a-AXIS | ≥0.67 | 15 | 43 | 42 | 74 | 1507 | 3.E+02 |
| REFERENCE EXAMPLE 17 | WURTZITE TYPE | 2.94 | a-AXIS | ≥0.67 | 10 | 49 | 41 | 83 | 1794 | 3.E+02 |
| REFERENCE EXAMPLE 18 | WURTZITE TYPE | 1.05 | a-AXIS | ≥0.67 | 6 | 52 | 42 | 90 | 2164 | 1.E+02 |
| REFERENCE EXAMPLE 19 | WURTZITE TYPE | 2.50 | a-AXIS | ≥0.67 | 9 | 44 | 47 | 83 | 2571 | 5.E+03 |
| REFERENCE EXAMPLE 20 | WURTZITE TYPE | 9.09 | a-AXIS | ≥0.67 | 8 | 46 | 46 | 84 | 2501 | 6.E+03 |
| REFERENCE EXAMPLE 21 | WURTZITE TYPE | 6.67 | a-AXIS | ≥0.67 | 8 | 45 | 47 | 84 | 2408 | 7.E+03 |
| REFERENCE EXAMPLE 22 | WURTZITE TYPE | 2.22 | a-AXIS | ≥0.67 | 8 | 46 | 46 | 86 | 2364 | 3.E+04 |
| REFERENCE EXAMPLE 23 | WURTZITE TYPE | 1.21 | a-AXIS | ≥0.67 | 7 | 46 | 47 | 87 | 3317 | 2.E+06 |
| REFERENCE EXAMPLE 24 | WURTZITE TYPE | 3.33 | a-AXIS | ≥0.67 | 6 | 51 | 43 | 89 | 2599 | 7.E+04 |

Next, since all the films according to the Examples of the present invention were wurtzite-type phase films having strong orientation, whether the films have a strong a-axis orientation or c-axis orientation of the crystal axis in a vertical direction (film thickness direction) with respect to the Si substrate S was examined by XRD. At this time, in order to examine the orientation of the crystal axis, the peak intensity ratio of (100)/(002) was measured, where (100) is the Miller index indicating a-axis orientation and (002) is the Miller index indicating c-axis orientation.

As a result, in the Examples in which film deposition was performed at a sputtering gas pressure of less than 0.67 Pa, the intensity of (002) was much stronger than that of (100), that is, the films exhibited a stronger c-axis orientation than a-axis orientation. In particular, in the Examples in which the deposit ion was performed at a sputtering gas pressure of 0.41 Pa or lower, the peak ratio of the diffraction peak intensity of a-axis orientation (100) relative to the diffraction peak intensity of c-axis orientation (002) (i.e., the diffraction peak intensity of a-axis orientation (100)/the diffraction peak intensity of c-axis orientation (002)) was 0.1 or lower.

On the other hand, in the Examples in which film deposition was performed at a sputtering gas pressure of 0.67 Pa or higher, the intensity of (100) was much stronger than that of (002), that is, the films exhibited a stronger a-axis orientation than c-axis orientation.

Note that it was confirmed that a wurtzite-type single phase was formed in the same manner even when the thin film thermistor portion 3 was deposited on a polyimide film under the same deposition condition. It was also confirmed that the crystal orientation did not change even when the thin film thermistor portion 3 was deposited on a polyimide film under the same deposition condition.

An exemplary XRD profile of a film according to the Example exhibiting a strong c-axis orientation and having an aforementioned peak ratio of 0.1 or lower is shown in FIG. 10. In this Example, Al/(Ti+Al) was equal to 0.84 (wurtzite-type, hexagonal), and the measurement was performed at an incidence angle of 1 degree. As can be seen from the result, the intensity (100) was much stronger than that of (002) in this Example.

In addition, an exemplary XRD profile of a film according to the Reference Example exhibiting a strong a-axis orientation is shown in FIG. 11. In this Reference Example, Al/(Ti+Al) was equal to 0.83 (wurtzite-type, hexagonal), the measurement was performed at an incidence angle of 1 degree. As can be seen from the result, the intensity of (100) was much stronger than that of (002) in this Reference Example.

Furthermore, in this Reference Example, the symmetrical measurement was performed at an incidence angle of 0 degree. It was confirmed that the peak with the asterisk (*) in the graph was a peak originating from the device, and thus, the peak with the asterisk (*) in the graph was neither a peak originating from a sample itself nor a peak originating from an impurity phase (which could also be confirmed from the fact that the peak with (*) was lost in the symmetrical measurement).

An exemplary XRD profile of a film according to a Comparative Example is shown in FIG. 12. In this Comparative Example, Al/(Ti+Al) was equal to 0.6 (NaCl type, cubic), and the measurement was performed at an incidence angle of 1 degree. No peak which could be indexed as a wurtzite-type (space group: $P6_3mc$ (No. 186)) was detected, and thus, the film according to this Comparative Example was confirmed as a NaCl-type single phase.

Next, the correlations between a crystal structure and its electric properties were further compared with each other in detail regarding the Examples and Reference Example of the present invention in which the wurtzite-type materials were employed.

Figure 13:
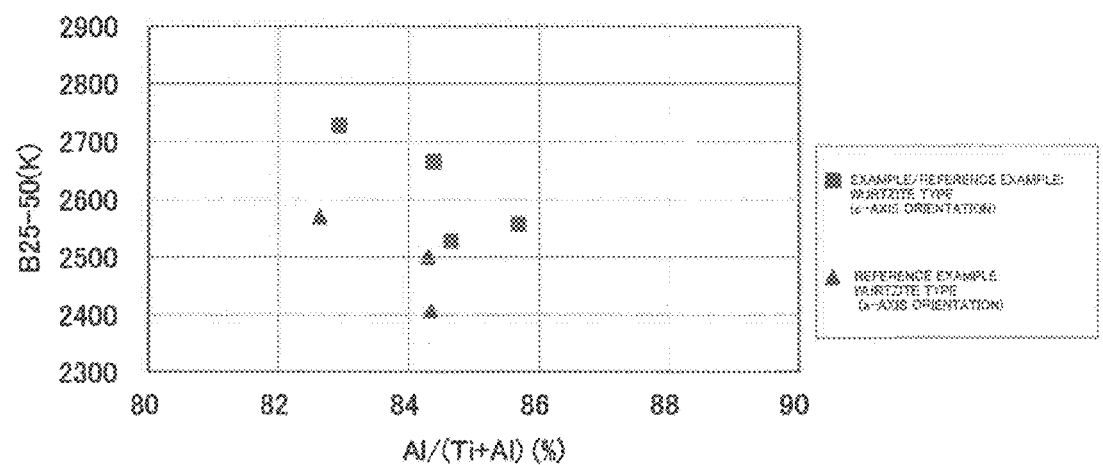
FIG. 13 is a graph illustrating the relationship between an Al/(Ti+Al) ratio and a B constant for the comparison of materials exhibiting a strong a-axis orientation according to Examples and materials exhibiting a strong c-axis orientation according to Examples and Reference Examples.

As shown in Table 3 and FIG. 13, the crystal axis of some materials (Reference Example 5 and Examples 7, 8, and 9) is strongly oriented along the c-axis in a vertical direction with respect to the surface of the substrate and that of other materials (Reference Examples 19, 20, and 21) is strongly oriented along the a-axis in a vertical direction with respect to the surface of the substrate among the materials having nearly the same Al/(Ti—Al) ratio.

When both groups were compared to each other, it was found that the materials having a strong c-axis orientation had a higher B constant by about 100 K than that of the materials having a strong a-axis orientation provided that they have nearly the same Al/(Ti+Al) ratio. When focus was placed on the amount of N (N/(Ti+Al+N)), it was found that the materials having a strong c-axis orientation had a slightly larger amount of nitrogen than that of the materials having a strong a-axis orientation. Since the ideal stoichiometric ratio of N/(Ti+Al+N) is 0.5, it was found that the materials having a strong c-axis orientation were ideal materials due to a small amount of nitrogen defects.

TABLE 3

| | CRYSTAL SYSTEM | WURTZITE TYPE | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURZITE TYPE (a-AXIS OR c-AXIS) | SPUTTERING GAS PRESSURE (Pa) | COMPOSITION RATIO Ti(%) | Al(%) | N(%) | Al/(Ti + Al) (%) | B CONSTANT (K) | SPECIFIC RESISTANCE VALUE AT 25° C. (Ω cm) |
|---|---|---|---|---|---|---|---|---|---|---|---|
| REFERENCE EXAMPLE 6 | WURTZITE TYPE | | 0.34 | c-AXIS | <0.67 | 9 | 43 | 48 | 83 | 2727 | 2.E+04 |
| EXAMPLE 7 | WURTZITE TYPE | | 0.09 | c-AXIS | <0.67 | 8 | 44 | 48 | 84 | 2665 | 3.E+03 |
| EXAMPLE 8 | WURTZITE TYPE | | 0.05 | c-AXIS | <0.67 | 8 | 44 | 48 | 85 | 2527 | 1.E+03 |
| EXAMPLE 9 | WURTZITE TYPE | | <0.01 | c-AXIS | <0.67 | 8 | 45 | 47 | 86 | 2557 | 8.E+02 |
| REFERENCE EXAMPLE 19 | WURTZITE TYPE | | 2.50 | a-AXIS | ≥0.67 | 9 | 44 | 47 | 83 | 2571 | 5.E+03 |
| REFERENCE EXAMPLE 20 | WURTZITE TYPE | | 9.09 | a-AXIS | ≥0.67 | 8 | 46 | 46 | 84 | 2501 | 6.E+03 |
| REFERENCE EXAMPLE 21 | WURTZITE TYPE | | 6.67 | a-AXIS | ≥0.67 | 8 | 45 | 47 | 84 | 2408 | 7.E+03 |

<Crystal Form Evaluation>

Figure 14:
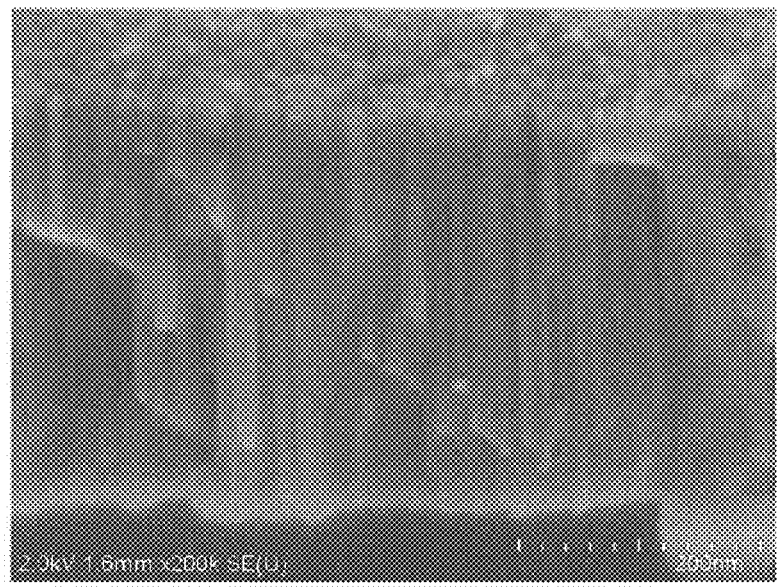
FIG. 14 is a cross-sectional SEM photograph illustrating a film exhibiting a strong c-axis orientation according to an Example of the present invention.
Figure 15:
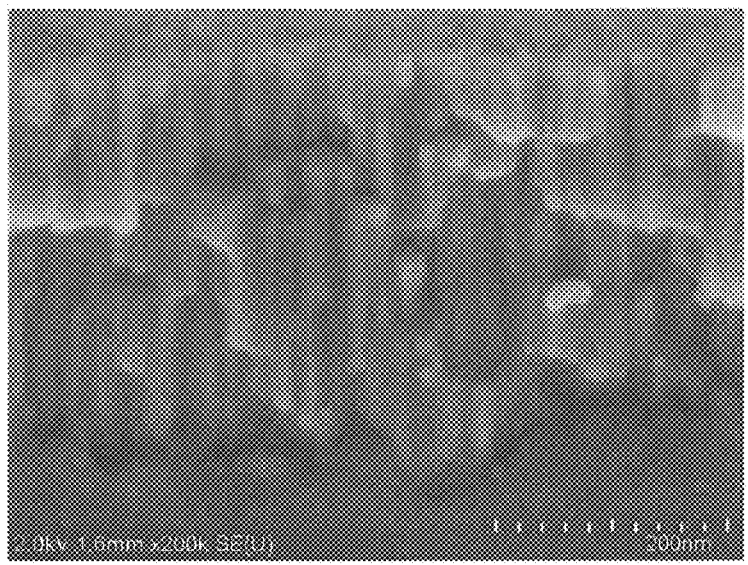
FIG. 15 is a cross-sectional SEM photograph illustrating a film exhibiting a strong a-axis orientation according to a Reference Example of the present invention.

Next, as an exemplary crystal form in the cross-section of the thin film thermistor portion 3, a cross-sectional SEM photograph of the thin film thermistor portion 3 according to the Example (where Al/(Ti+Al)=0.84, wurtzite-type hexagonal, and strong c-axis orientation), which is deposited on the Si substrate S with a thermal oxidation film, is shown in FIG. 14. In addition, a cross-sectional SEM photograph of the thin film thermistor portion 3 according to the Reference Example (where Al/(Ti+Ai)=0.83, wurtzite-type hexagonal, and strong a-axis orientation) is shown in FIG. 15.

The samples of these Example and Reference Example were obtained by breaking the Si substrates S by cleavage. The photographs were taken by tilt observation at an angle of 45 degrees.

As can be seen from these photographs, the samples were formed of high-density columnar crystals in both of the Example and Reference Example. Specifically, the growth of columnar crystals in a vertical direction with respect to the surface of the substrate was observed both in the Example revealing a strong c-axis orientation and the Reference Example revealing a strong a-axis orientation. Note that the break of the columnar crystals was generated upon breaking the Si substrate S by cleavage.

<Heat Resistance Test Evaluation>

In the Example, Reference Examples, and Comparative Example shown in Table 4, a resistance value and a B constant before and after the heat resistance test at a temperature of 125° C. for 1000 hours in air were evaluated. The results are shown in Table 4. A conventional Ta—Al—N-based film according to the Comparative Example was also evaluated in the same manner for comparison.

As can be seen from these results, although the Al concentration and the nitrogen concentration vary, the heat resistance of the Ti—Al—N-based film based on the electric properties change before and after the heat resistance test is more excellent than that of the Ta—Al—N-based film according to the Comparative Example when comparison is made by using the film according to the Example having the same B constant as that of the Ta—Al—N-based film according to the Comparative Example. Note that the materials according to Reference Example 5 and Examples 8 have a strong c-axis orientation, and the materials according to Reference Examples 21 and 24 have a strong a-axis orientation. When both groups were compared to each other, the heat resistance of the films according to the Example and Reference Example revealing a strong c-axis orientation is slightly improved as compared with that of the films according to the Reference Examples revealing a strong a-axis orientation.

Note that, in the Ta—Al—N-based material, the ionic radius of Ta is much larger than that of Ti and Al, and thus, a wurtzite-type phase cannot be produced in the high-concentration Al region. It is contemplated that the Ti—Al—N-based material having a wurtzite-type phase has better heat resistance than the Ta—Al—N-based material because the Ta—Al—N-based material is not a wurtzite-type phase.

TABLE 4

| | M ELEMENT | M(%) | Al(%) | N(%) | Al/(M + Al) (%) | B25-50 (K) | SPECIFIC RESISTANCE VALUE AT 25° C. (Ω cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|
| COMPARATIVE EXAMPLE | Ta | 60 | 1 | 39 | 2 | 2671 | 5.E+02 | 25 | 16 |
| REFERENCE EXAMPLE 5 | Ti | 9 | 43 | 48 | 83 | 2727 | 2.E+04 | <4 | <1 |
| EXAMPLE 8 | Ti | 8 | 44 | 48 | 85 | 2527 | 1.E+03 | <4 | <1 |
| REFERENCE EXAMPLE 21 | Ti | 8 | 45 | 47 | 84 | 2408 | 7.E+03 | <5 | <1 |
| REFERENCE EXAMPLE 24 | Ti | 6 | 51 | 43 | 89 | 2599 | 7.E+04 | <5 | <1 |

The technical scope of the present invention s not limited to the aforementioned embodiments and Examples, but the present invention may be modified in various ways without departing from the scope or teaching of the present invention.

For example, in the above-described embodiments, although the pair of pattern electrodes (opposed electrode portions) is formed on the thin film thermistor portion, the pair of pattern electrodes may be formed under the thin film thermistor portion.

REFERENCE NUMERALS

1: film type thermistor sensor, 2: insulating film, 3: thin film thermistor portion, 4: pattern electrode

What is claimed is:

1. A thermistor comprising:
   a metal nitride material,
   the metal nitride material consisting of a metal nitride represented by the general formula: $Ti_xAl_yN_z$, where $0.70 \leq y/(x+y) \leq 0.95$, $0.4 \leq z \leq 0.5$, and $x+y+z=1$,
   wherein a crystal structure of the metal nitride material is a hexagonal wurtzite-type single phase, and
   the peak ratio of the diffraction peak intensity of a-axis orientation relative to the diffraction peak intensity of c-axis orientation is 0.1 or lower in X-ray diffraction.

2. A film type thermistor sensor, comprising:
   an insulating film;
   a thin film thermistor portion made of according to claim 1 formed on the insulating film; and
   a pair of pattern electrodes formed at least on or under the thin film thermistor portion.

3. A method for producing the thermistor according to claim 1, the method comprising a deposition step of performing deposition by reactive sputtering in a nitrogen-containing atmosphere using a Ti—Al alloy sputtering target, wherein the sputtering gas pressure during the reactive sputtering is set to 0.41 Pa or lower.

* * * * *